United States Patent [19]

Lundin

[11] Patent Number: 4,636,662

[45] Date of Patent: Jan. 13, 1987

[54] METHOD AND MEANS FOR INCREASING THE FREQUENCY OF UPDATE OF DIRECTION INFORMATION CONTAINED IN TWO SINE WAVES IN QUADRATURE

[75] Inventor: Robert S. Lundin, Northfield, Conn.

[73] Assignee: The Superior Electric Company, Bristol, Conn.

[21] Appl. No.: 671,318

[22] Filed: Nov. 14, 1984

[51] Int. Cl.⁴ .......................... H03K 1/12; H03L 7/00
[52] U.S. Cl. .................................... 307/512; 307/525; 328/133; 324/165; 340/672
[58] Field of Search ................. 328/133, 166; 307/512, 307/514, 515, 525; 324/165; 340/672

[56] References Cited

U.S. PATENT DOCUMENTS 3,517,322  6/1970  Lay .................................... 307/514
3,710,265  1/1973  Gray ................................... 328/166
3,840,817  10/1974 Seki .................................... 307/514

Primary Examiner—Stanley D. Miller
Assistant Examiner—Trong Q. Phan
Attorney, Agent, or Firm—John H. Crozier

[57] ABSTRACT

A method and means are provided for increasing the frequency of update of direction information contained in two essentially identical alternating current signals, essentially sinusoidal in waveform, and in quadrature. Eight electrical signals having rectangular waveforms are generated from the two primary signals. The eight signals are differentiated and the eight derivatives combined with the eight signals into two sets of eight additive pairs each, with a high level logic signal from one set indicating one direction and a high level logic signal from the other set indicating the opposite direction. The direction information is updated eight times during each full cycle of each of the two primary signals.

6 Claims, 3 Drawing Figures

METHOD AND MEANS FOR INCREASING THE FREQUENCY OF UPDATE OF DIRECTION INFORMATION CONTAINED IN TWO SINE WAVES IN QUADRATURE

BACKGROUND AND SUMMARY OF THE INVENTION

The present invention relates to a method and means for increasing the frequency of update of direction information contained in two, essentially identical, alternating current signals, essentially sinusoidal in waveform, and which are in quadrature. Although the invention is described as receiving sinusoidal information produced by a rotary magnetic encoder, such is for illustrative purposes only and it will be understood that the invention is applicable to any case where it is desired to increase the frequency of update of direction information contained in two signals of similar characteristics.

A rotary magnetic encoder is a well-known device which typically includes a cylindrical rotating magnetic member, upon the outer circumference of which is a continuous series of N-S pairs of magnetic poles. A stationary member holds one or more detectors so disposed that, as the rotating member rotates, the flux at successive magnetic poles links those poles with the detector and the detector produces a characteristic alternating current sine wave output. Each full cycle of the sine wave represents the movement of one N-S pair of poles past the detector. Typically, it is found in decoding the sinusoidal information, that it is desirable to generate a digital pulse at each point at which the sine wave has a value of zero (or a "zero crossing"). Since a full cycle has two zero crossing, there will be generated two pulses for each full sine wave. It is common to employ two detectors on the stationary member, displaced 90 electrical degrees from one another with respect to the magnetic poles, in order to provide direction information and in order to double the number of total pulses per cycle for increased resolution. Direction information is obtained from the two sine waves through conventional means, by detecting which sine wave is leading the other. Thus, direction information is updated four times per revolution.

Conventional techniques are known for increasing the number of pulses per cycle to eight or more, but, in the process of so doing, direction information is lost. Accordingly, it is an object of this invention to provide a method and means to increase the frequency of update of direction information to eight times per full sine wave. The present invention accomplishes this in a novel manner by generating eight rectangular waveforms from the two primary sine waves. The derivatives of the eight rectangular waveforms are then taken and combined with the rectangular waveforms from which they are derived into two sets of eight additive pairs each, with a high level logic signal from one set indicating one direction and a high level logic signal from the other set indicating the opposite direction. The direction information is updated eight times during each full cycle of each primary sine wave.

It will be understood that, in accordance with conventional nomenclature, "sine wave" as used herein means an electrical signal essentially sinusoidal in waveform, and "rectangular waveform" as used herein means an electrical signal essentially rectangular in waveform.

DESCRIPTION OF THE PREFERRED EMBODIMENT

Figure 1:
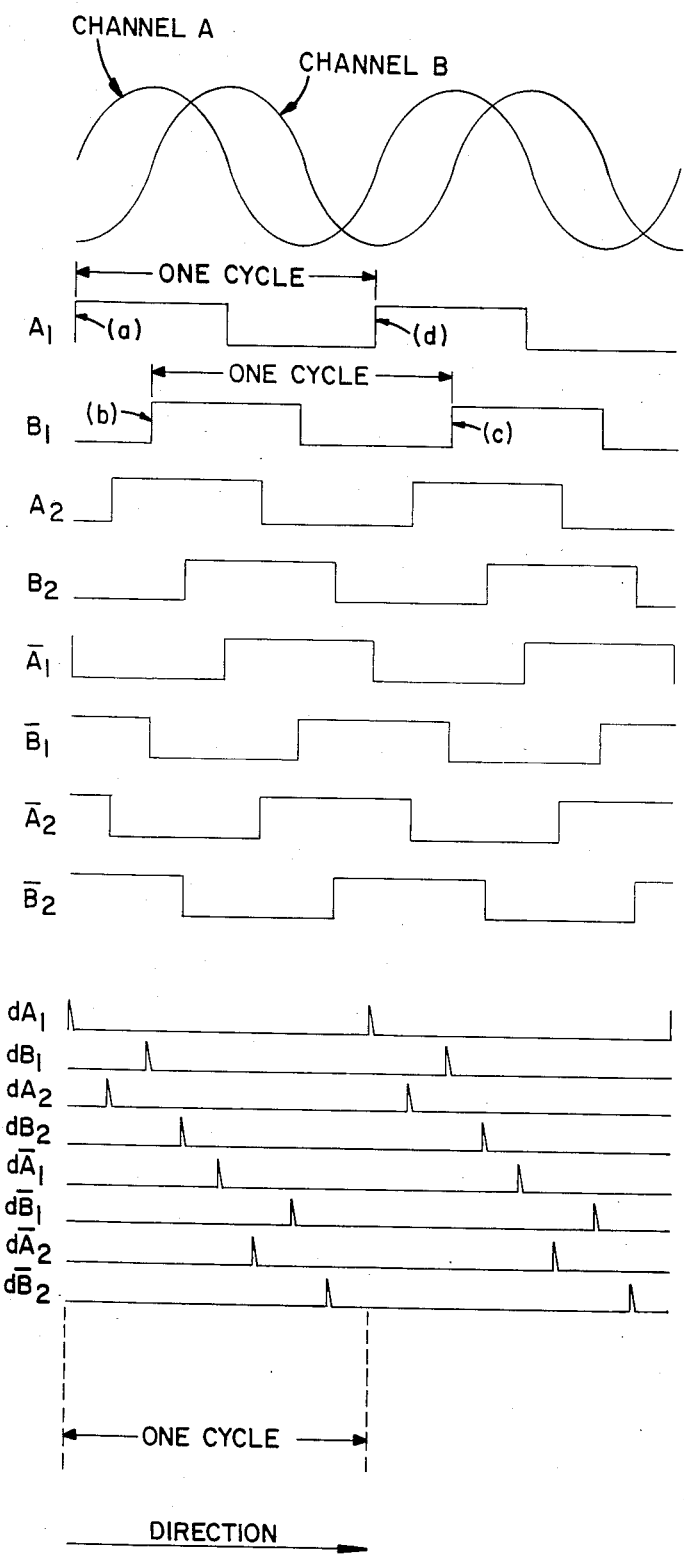
FIG. 1 shows the primary sinusoidal information waves and the rectangular waveforms and pulse trains derived therefrom for a first direction of information.

Referring to the Drawing, FIG. 1 shows the primary sine waves and the rectangular waveforms and pulse trains derived therefrom which graphically describe the method of the present invention. The curves marked "Channel A" and "Channel B" may be assumed to be electrical signals, essentially sinusoidal in waveform, and which are in quadrature, produced, for illustrative purposes only, by two detectors in a rotary magnetic encoder as described above. It will be understood that the "sine waves" may not necessarily be pure sine waves, but are periodic waves having sinusoidal characteristics, and that, consequently, the rectangular waveforms shown may not necessarily be precisely rectangular.

Processing the sine waves through zero crossing detector circuits produces the on-off rectangular waveforms marked $A_1$ and $B_1$. Conventionally, direction information is obtained by determining which sine wave is leading the other. For example, if direction were from left to right, the switching of rectangular waveform $A_1$ from off to on, as at (a), would be detected as leading the switching of rectangular waveform $B_1$, from off to on, as at (b). Conversely, if direction were from right to left, the switching of rectangular waveform $B_1$, as at (c), would be detected as leading the switching of rectangular waveform $A_1$, as at (d). It can be seen that direction information is thus updated four times in each full cycle of one primary sine wave.

The present invention increases the frequency of update of direction information to eight times per full cycle of one primary sine wave, as follows. Two additional rectangular waveforms are generated, marked $A_2$ and $B_2$. Rectangular waveform $A_2$ is produced by adding sine waves A and B and passing the sum through a zero detector circuit. Rectangular waveform $B_2$ is generated by subtracting sine wave A from sine wave B and passing the difference through a zero detector circuit. Also, rectangular waveforms $\bar{A}_1$, $\bar{B}_1$, $\bar{A}_2$, and $\bar{B}_2$, are generated. The latter four rectangular waveforms are the "not" equivalents of the former four rectangular waveforms. Thus, eight rectangular waveforms displaced by intervals of 45° have been generated from the two primary sine waves.

Each of the first eight rectangular waveforms, $A_1$ through $\bar{B}_2$, on FIG. 1, is differentiated to obtain pulse trains $dA_1$ through $d\bar{B}_2$, also shown on FIG. 1. The differentiated pulse trains $dA_1$ through $d\bar{B}_2$ show the transition from low level to high level of the related rectangular waveforms $A_1$ through $\bar{B}_2$, respectively. It follows, then, that the direction is as shown when R (for the direction shown) $= \bar{B}_1 \cdot dA_1 + B_1 \cdot d\bar{A}_1 + \bar{B}_2 \cdot dA_2 + B_2 \cdot d\bar{A}_2 + A_1 \cdot dB_1$.

$+\bar{A}_1 \cdot d\bar{B}_1 + A_2 \cdot dB_2 + \bar{A}_2 \cdot d\bar{B}_2$, in Boolean algebra notation. Thus, when any one of the eight sums is a high value, R will be a high value. Inspecting the rectangular waveforms and pulse trains of FIG. 1, it can be seen that each of the eight pairs of sums in the foregoing equation is at a high value during each full cycle of each primary sine wave. Therefore, direction information is updated eight times during each full cycle and any one of the eight sums can be at a high level only when the direction is as shown.

Figure 2:
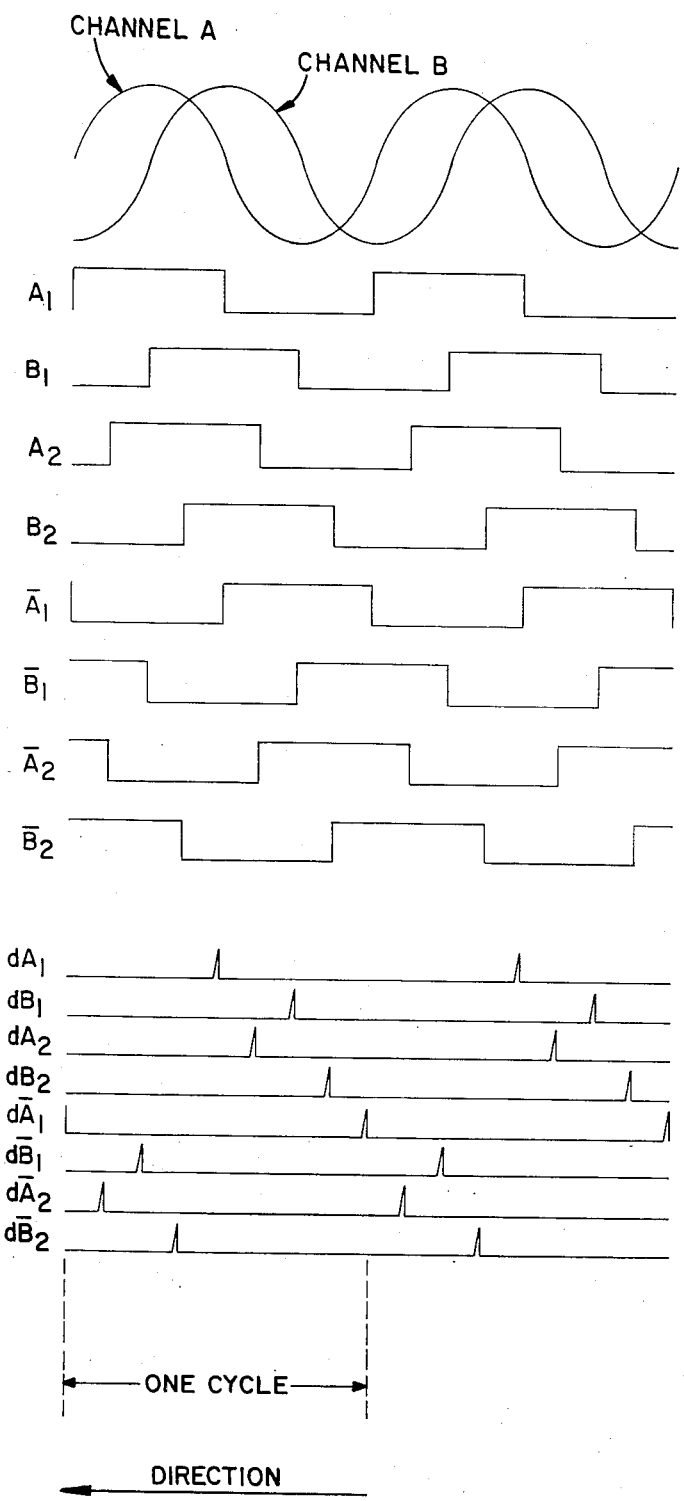
FIG. 2 shows the primary sinusoidal information waves and the rectangular waveforms and pulse trains derived therefrom for a second direction of information.

When, on the other hand the direction is reversed, the transitions which were high-to-low will become low-to-high, and vice versa, and the rectangular waveforms and pulse trains shown on FIG. 2 are obtained which are the counterparts to the similarly marked rectangular waveforms and pulse trains on FIG. 1. In this direction, the signal S (the counterpart to R)=$\bar{B}_1 \cdot d\bar{A}_1' + \bar{B}_2 \cdot \bar{A}_2' + A_1 \cdot d\bar{B}_1' + A_2 \cdot d\bar{B}_2' + B_1 \cdot dA_1 \cdot ' + B_2 \cdot dA_2' + \bar{A}_1 \cdot dB_1 + \bar{A}_2 \cdot dB_2'$. It can be seen by examining the makeup of R and S that they are mutually exclusive: when R is high, S is low, and vice versa.

Figure 3:
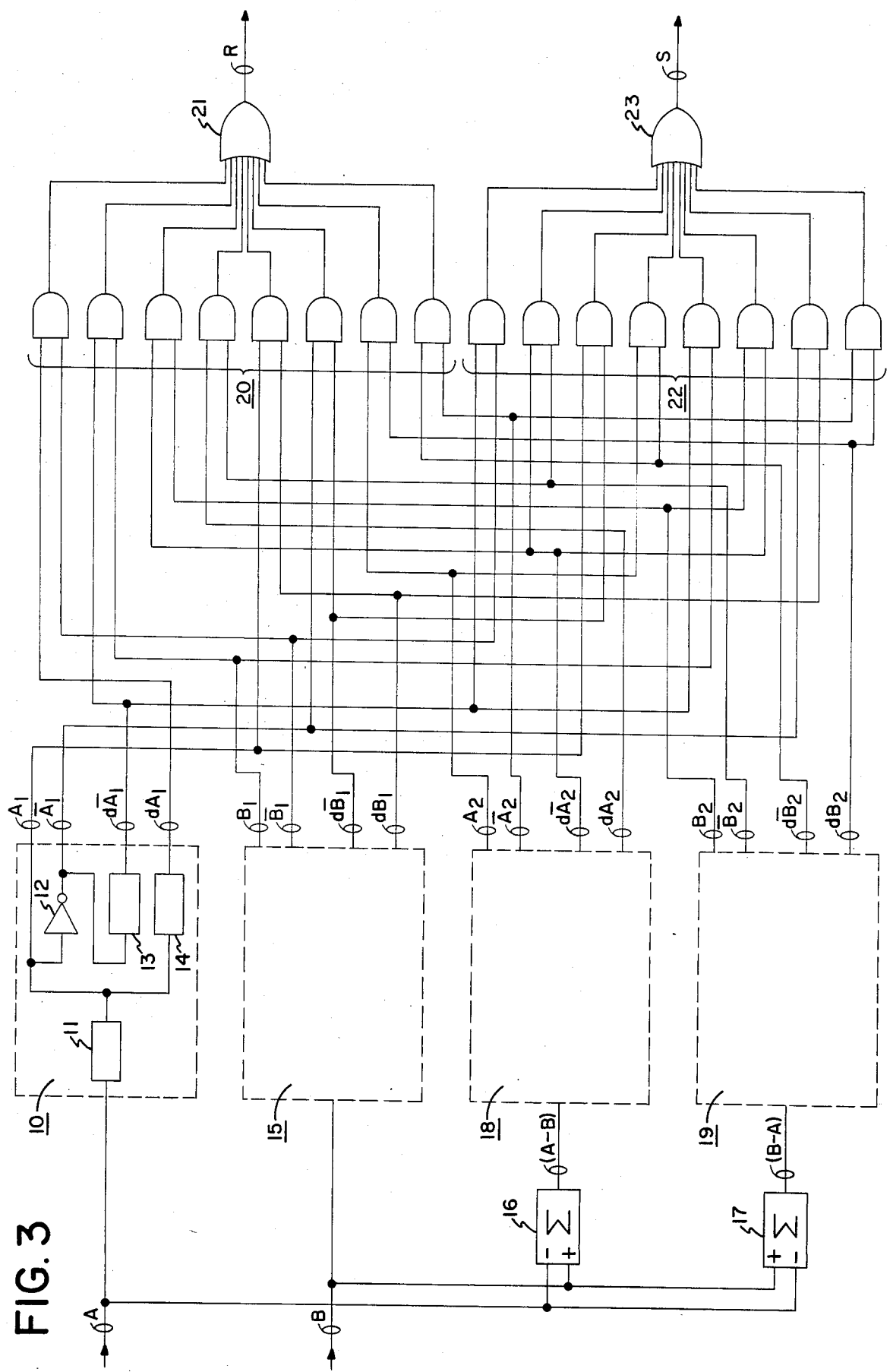
FIG. 3 is a schematic of the circuitry for producing two signals containing direction information.

FIG. 3 is a block diagram of circuitry for producing the rectangular waveforms and pulse trains necessary for the above equations for R and S. Primary sine wave A is fed to a circuit, indicated generally by the reference numeral 10, which includes a zero crossing detector 11, an inverter 12, and differentiators 13 and 14. The zero crossing detector 11 produces rectangular waveform $A_1$ directly from sine wave A. Rectangular waveform $A_1$ is fed to the inverter 12 which produces rectangular waveform "not $A_1$", noted as $\bar{A}_1$. The differentiators 13 and 14 produce pulse trains $d\bar{A}_1$ and $dA_1$ from rectangular waveforms $\bar{A}_1$ and $A_1$, respectively. Similarly, primary sine wave B is fed to a circuit indicated generally by the reference numeral 15, which contains components identical to those in circuit 10. Sine waves A and B are also fed to a first adder 16 which produces sine wave (A+B) and to a second adder which produces sine wave (B−A). Sine waves (A+B) and (B−A) are fed, respectively, to circuits indicated generally by the reference numerals 18 and 19, respectively, which also contain components identical to those in circuit 10 and which produce the rectangular waveforms and pulse trains shown.

The sixteen pulse trains produced by circuits 10, 15, 18, and 19 are fed in pairs, as shown, to eight logic AND gates, generally indicated by the reference numeral 20, the outputs of which are the inputs for logic OR gate 21. The sixteen pulse trains are also fed in pairs, as shown, to another set of eight logic AND gates, generally indicated by the reference numeral 22, the outputs of which are the inputs of logic OR gate 23.

The output of the logic OR gate 21 is direction signal R and the output of logic OR gate 23 is the direction signal S which indicates a direction opposite to that indicated by signal R. For example, when the rectangular waveform $\bar{B}_1$ and the pulse train $dA_1$ are at high logic levels, logic AND gate 24 produces a high output causing logic OR gate 21 to conduct and indicate direction R. A similar result is obtained when any of the other pairs of signals to any logic AND gate in the set 20 are at a high level. Conversely, when the rectangular waveform $\bar{B}_1$ and the pulse train $d\bar{A}_1$ are at high logic levels, logic AND gate 25 produces a high output causing logic OR gate 23 to conduct and indicate direction S.

It will be understood that what has been disclosed is a method and means for increasing the frequency of update of direction information contained in two sine waves in quadrature. While the above description of an embodiment in the present invention has been made in terms of doubling the rate of direction information update, it will be understood that the invention may be applied to provide further increases in the rate of direction information update by one having ordinary skill in the art.

Since certain changes may be made in carrying out the above invention without departing from the scope thereof, it is intended that all matter contained in the above description or shown in the accompanying Drawing shall be interpreted as illustrative and not in a limiting sense.

It is also intended that the following Claims are intended to cover all of the generic and specific features of the invention herein described, and all statements of the scope of the invention which, as a matter of language, might be said to fall therebetween.

I claim:

1. A method of increasing the frequency of update of direction information embedded in two, essentially identical, alternating current signals, essentially sinusoidal in waveform, and which are in quadrature, comprising:
   (a) generating eight, on-off, electrical signals, essentially rectangular in waveform, from said two alternating current signals, said eight electrical signals being displaced by intervals of 45°;
   (b) differentiating said eight electrical signals, to produce eight electrical pulse trains, the pulses in a train representing the positive-going transitions in the electrical signal of which the derivative was taken; and
   (c) combining said eight pulse trains and said eight electrical signals in pairs, such that when a pulse train and its paired electrical signal are each at a high level, a direction will be uniquely indicated;

wherein direction information is updated eight times during each full cycle of each of said two alternating current signals.

2. The method defined in claim 1, further defined, wherein said pairs of pulse trains and signals are combined into first and second sets of eight pairs each, such that when there is a positive output from said first set, one direction is indicated, and when there is a positive output from said second set, the opposite direction is indicated.

3. A method of increasing the frequency of update of direction information embedded in first and second, essentially identical, alternating current signals, essentially sinusoidal in waveform, and which are in quadrature, comprising:
   (a) deriving a third signal which is the sum of said first and second signals;
   (b) deriving a fourth signal which is said second signal less said first signal;
   (c) generating four, on-off, electrical signals, essentially rectangular in waveform, from said first, second, third, and fourth signals;
   (d) generating four, on-off, electrical signals which are the logical "not" equivalents of said four signals generated in (c);
   (e) differentiating said eight electrical signals generated in (c) and (d) to produce eight electrical pulse trains, the pulses in a train representing the positive-going transmissions in the signal of which the derivative was taken;

(f) combining said pulse trains and said eight electrical signals in pairs, such that when a pulse train and its paired signal are each at a high level, a direction will be uniquely indicated; and (g) combining said pairs of (f) into first and second sets of eight pairs each, such that when there is a positive output from said first set, one direction is indicated, and when there is a positive output from said second set, the opposite direction is indicated; wherein direction information is updated eight times during each full cycle of each of said first and second signals.

4. A device for increasing the frequency of update of direction information embedded in two, essentially identical, alternating current signals, essentially sinusoidal in waveform, and which are in quadrature, comprising:

(a) generating means for generating eight, on-off, electrical signals, essentially rectangular in waveform, from said two alternating current signals, said eight electrical signals being displaced by intervals of 45°;

(b) differentiating means connected to said generating means for differentiating said eight electrical signals, to produce eight electrical pulse trains, the pulses in a train representing the positive-going transitions in the signal of which the derivative was taken; and (c) combining means connected to said generating and differentiating means for combining said eight pulse trains and said eight electrical signals in pairs, such that when a pulse train and its paired electrical signal are each at a high level, a direction will be uniquely indicated;

wherein direction information is updated eight times during each full cycle of each of said two alternating current signals.

5. The device defined in claim 1, further comprising means connected to said combining means for combining said pairs of pulse trains and signals into first and second sets of eight pairs each, such that when there is a positive output from said first set, one direction is indicated, and when there is a positive output from said second set, the opposite direction is indicated.

6. A device for increasing the frequency of update of direction information embedded in first and second, essentially identical, alternating current signals, essentially sinusoidal in waveform, and which are in quadrature, comprising:

(a) a first adder to generate a third signal from said first and second signals, which is the sum of said first and second signals;

(b) a second adder to generate a fourth signal from said first and second signals, which is said second signal less said first signal;

(c) four zero crossing detectors connected to said first and second adders to generate four, on-off, electrical signals, essentially rectangular in waveform, from said first, second, third, and fourth signals;

(d) four inverters connected to said zero crossing detectors to generate, from said four signals generated in (c), the logical "not" equivalents of those signals;

(e) eight differentiators connected to said zero crossing detectors and inverters to generate from said eight signals generated in (c) and (d) eight electrical pulse trains, a train representing the positive-going transitions in the signal of which the derivative was taken;

(f) first and second sets of eight each of logic AND gates connected to said zero crossing detectors, inverters, and differentiators which have as inputs pairs of said eight pulse trains and said eight signals generated in (c) and (d), such that when a pulse train and its paired signal are each at a high level, the logic AND gate of which such pair is the input will conduct and uniquely indicate a first direction or second direction opposite from said first direction, the outputs from said first set of logic AND gates indicating said first direction and the outputs of said second set of logic AND gates indicating said second direction;

(g) a first logic OR gate connected to said first set of logic AND gates, the inputs to which OR gate are the outputs of said first set of logic AND gates; and (h) a second logic OR gate connected to said second set of logic AND gates, the inputs to which OR gate are the outputs of said second set of logic AND gates;

wherein the direction information embedded in said first and second signals is updated eight times during each full cycle of each of said first and second signals, with a pulse output from said first logic OR gate indicating said first direction and a pulse output from said second logic OR gate indicating said second direction.

* * * * *